(12) United States Patent
Nordal (10) Patent No.: US 6,804,139 B2
(45) Date of Patent: Oct. 12, 2004

(54) METHOD FOR NON-DESTRUCTIVE READOUT AND APPARATUS FOR USE WITH THE METHOD

(75) Inventor: Per-Erik Nordal, Asker (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/169,381

(22) PCT Filed: Nov. 27, 2001

(86) PCT No.: PCT/NO01/00472
§ 371 (c)(1),
(2), (4) Date: Jul. 2, 2002

(87) PCT Pub. No.: WO02/43070
PCT Pub. Date: May 30, 2002

(65) Prior Publication Data
US 2002/0191435 A1 Dec. 19, 2002

(30) Foreign Application Priority Data
Nov. 27, 2000 (NO) .............................................. 006002

(51) Int. Cl.[7] .............................................. G11C 11/22
(52) U.S. Cl. ........................................ 365/145; 365/65
(58) Field of Search .......................... 365/145, 65, 109, 365/117

(56) References Cited

U.S. PATENT DOCUMENTS

| | | | |
|---|---|---|---|
| 3,132,326 A | 5/1964 | Crownover | 365/145 |
| 5,060,191 A | 10/1991 | Nagasaki et al. | 365/145 |
| 5,151,877 A | 9/1992 | Brennan | 365/145 |
| 5,262,982 A | 11/1993 | Brassington et al. | 365/145 |
| 5,530,667 A | 6/1996 | Omura et al. | 365/145 |
| 5,666,305 A | 9/1997 | Mihara et al. | 365/145 |
| 5,729,488 A * | 3/1998 | Drab et al. | 365/145 |
| 5,835,400 A * | 11/1998 | Jeon et al. | 365/145 |
| 6,563,729 B2 * | 5/2003 | Brucklmeier et al. | 365/145 |
| 6,574,134 B1 * | 6/2003 | Chen et al. | 365/145 |

FOREIGN PATENT DOCUMENTS

| | | |
|---|---|---|
| JP | 5-129622 A | 5/1993 |
| JP | 6-275062 A | 9/1994 |

* cited by examiner

Primary Examiner—Anh Phung
(74) Attorney, Agent, or Firm—Birch, Stewart, Kolasch & Birch, LLP (57) ABSTRACT

A method for determining a logic state of a memory cell in a data storage device, wherein the cell stores data in the form of an electrical polarization state in a capacitor containing a polarizable material, includes applying a time-dependent small signal voltage over the capacitor, and recording at least one component of a generated small-signal current response over said capacitor. Correlation analysis is performed on the response based on a reference signal derived from the time dependent small signal voltage to determine the logic state of the memory cell. An apparatus performing a phase comparison according to this method includes a phase detector connected with a memory cell for detecting at least one phase in the response signal. The apparatus is configured to determine the logic state of the memory cell by comparing the detected phase and a phase reference signal.

23 Claims, 10 Drawing Sheets

METHOD FOR NON-DESTRUCTIVE READOUT AND APPARATUS FOR USE WITH THE METHOD

This application is the national phase under 35 U.S.C. § 371 of PCT International Application No. PCT/NO01/00472 which has an International filing date of Nov. 27, 2001, which designated the United States of America.

BACKGROUND OF THE INVENTION

1. Field of the Invention

The present invention concerns a method for determining a logic state of a memory cell in a data storage device, wherein said cell stores data in the form of an electrical polarization state in a capacitor containing a polarizable material, wherein said polarizable material is capable of maintaining a non-vanishing electrical polarization in the absence of an externally impressed voltage across said capacitor, and of generating a current response to an applied voltage, said current response comprising linear and non-linear components. The present invention also concerns a first apparatus for performing a phase comparison in a method according to the invention wherein the apparatus comprises a signal generator for supplying a read signal with given frequency to a memory cell, wherein the memory cell in response to the read signal outputs a response component at twice the given phase of the read signal; as well as a second apparatus for performing a phase comparison in the method according to the invention, wherein the apparatus comprises a signal generator for supplying two or more read signals with given phases to a memory cell, wherein the memory cell in response to said read signals outputs a response signal having two or more non-linear current components.

Particularly the present invention concerns a non-destructive readout of memory cells, wherein the polarizable material exhibits hysteresis, notably an electret or a ferroelectric material, as known in the art.

2. Description of Related Art

During recent years, data storage has been demonstrated in electrically polarizable media consisting of thin films of ceramic or polymeric ferroelectrics. A major advantage of such materials is that they retain their polarization without the permanent supply of electrical energy, i.e. the data storage is non-volatile.

Two main classes of memory devices have been demonstrated where the logic state of an individual memory cell is represented by the polarization direction of the ferroelectric thin film in that cell. In both cases data are written into the memory cells by polarizing the film in the desired direction through the application of an appropriately directed electrical field exceeding the coercive field of the ferroelectric. However, device architectures are fundamentally different:

In the first class of devices, each memory cell incorporates at least one transistor. The overall memory architecture is of the active matrix type, the major advantage compared with traditional SRAM and DRAM devices being the non-volatile nature of the ferroelectrically stored logic state.

Figure 1:
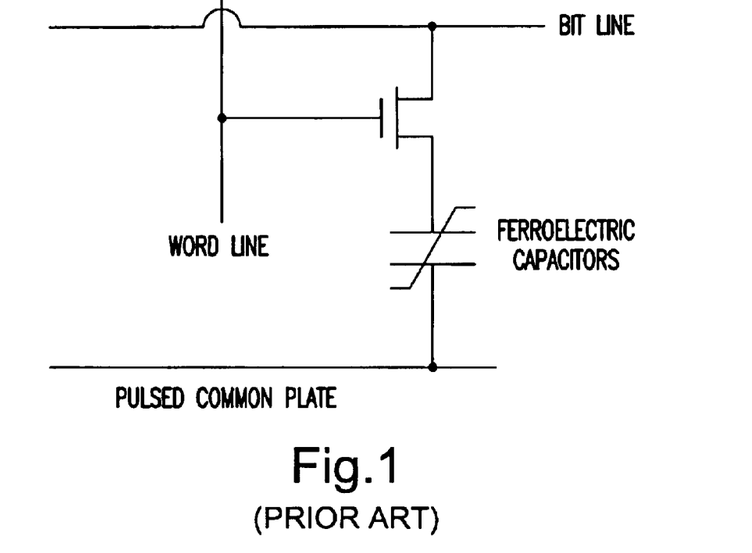
FIG. 1 shows an example of a prior art 1C-1T ferroelectric memory cell structure incorporating one transistor and one ferroelectric capacitor in each cell, as mentioned above.

One broad sub-class of such ferroelectric-based memory devices, commonly termed FeRAM or FRAM (a Symetrix copyrighted term), is extensively described in the scientific and patent literature and is presently being commercialized by a number of companies worldwide. In its simplest form (1T-1C architecture), each FeRAM memory cell has a single transistor and capacitor as illustrated in FIG. 1, where the capacitor contains a ferroelectric which can be polarized in one or the other direction, representing a logic "0" or "1", respectively. A given memory cell is written, i.e. prepared with the ferroelectric capacitor polarized in the desired direction, by applying appropriate voltages to the wordline, bitline and driveline serving that cell. Reading is performed by floating the bitline and applying a positive voltage to the driveline while asserting the wordline. Depending on the direction of polarization in the capacitor, i.e. whether the cell stores a logic "0" or a "1", the charge transferred to the bitline in this process shall be either significant or small, and the logic state of the cell is determined by recording the magnitude of this charge. Since this read operation is destructive, the data must be written back afterwards to avoid permanent loss of stored information. A large number of patents have been issued on variants of the basic FeRAM concept, see, e.g. U.S. Pat. No. 4,873,664 (Ramtron International Corp.), U.S. Pat. No. 5,539,279 (Hitachi, Ltd), U.S. Pat. No. 5,530,668 (Ramtron International Corp), U.S. Pat. No. 5,541,872 (Micron Technology), U.S. Pat. No. 5,550,770 (Hitachi, Ltd), U.S. Pat. No. 5,572,459 (Ramtron International Corp), U.S. Pat. No. 5,600,587 (NEC Corp.), U.S. Pat. No. 5,883,828 (Symetrix Corp.). The patents address both circuit architectures and materials, reflecting difficult problems that have hindered practical implementation of ferroelectric memories since their conceptual introduction decades ago. Thus, the destructive read aspect of these memories has comported fatigue in the ferroelectric materials used, limiting the operational lifetime and thus basic usability for large classes of applications. Following intensive efforts, certain materials (e.g. PZT and SBT) have been refined and modified so as to sustain the large number of switching cycles (10 exp 10 to 10 exp 14) of relevance in the most demanding applications, as well as exhibiting adequate resistance to imprint, etc. However, these optimized materials require annealing at high temperatures, are vulnerable to hydrogen exposure, etc, and generally pose costly and complex problems in connection with integration into high volume production based on established silicon device manufacturing. Further, their requirement for thermal treatment makes them unsuitable for future integration in polymer-based electronic devices. Some of the patents reflect efforts to circumvent drift and manufacturing tolerance problems by making use of more complex architectures. This may include memory cells containing two ferroelectric capacitors and two transistors (2C-2T designs) to allow for referencing cells and circuits and more complex pulsing protocols. It may be noted that at present all ferroelectric memories in production use the 2C-2T architecture, since materials are still lacking that have adequate stability under exposure to time, temperature and voltage cycling (cf.: D. Hadnagy: "Making ferroelectric memories", The Industrial Physicist, pp.26–28 (December 1999)).

In another subclass of devices employing one or more transistors in each memory cell, the source-drain resistance of a transistor in the cell is directly or indirectly controlled by the polarization state in a ferroelectric capacitor in that cell. The basic idea is not new and has been described in the literature (cf., e.g. Noriyoshi Yamauchi, "A metal-Insulator-Semiconductor (MIS) device using a ferroelectric polymer-thin film in the gate insulator", Jap.J.Appl.Phys. 25, 590–594 (1986); Jun Yu et al., "Formation and characteristics of Pb(Zr,Ti)O$_3$ buffer layer", Appl.Phys.Lett. 70, 490–492 (1997); Si-Bei Xiong and Shigeki Sakai "Memory properties of SrBi$_2$Ta$_2$O$_9$ thin films prepared on SiO$_2$/Si substrates", Appl.Phys.Lett. 70, 1613–1615 (1999)). In U.S. Pat. No. 5,592,409 (Rohlm Co., Ltd.), Nishimura et al.

describe a non-volatile memory based on a ferroelectric film which is polarized in one or the other direction, representing a logic "0" or "1". The polarized ferroelectric provides bias on the gate of a transistor, thereby controlling the current flow through the transistor. An obvious advantage of this mode of operation is that the logic state of the memory cell can be read non-destructively, i.e. without incurring polarization reversal in the ferroelectric capacitor. A related concept, described by J. T. Evans and J. A. Bullington in U.S. Pat. No. 5,070,385, is based on a semiconductor material in close contact with the ferroelectric. Here, the semiconducting material exhibits an electrical resistance which depends on the state of polarization in the ferroelectric. Unfortunately, there remain severe unsolved materials—and processing issues in connection with all of the above mentioned concepts (cf., e.g. D. Hadnagy, "Making ferroelectric memories", The Industrial Physicist, pp.26–28 (December 1999)), and their successful commercialization in the foreseeable future is at present doubtful.

In both subclasses referred above, the need for one or more transistors in each cell represents a major disadvantage in terms of complexity and reduced areal data storage density.

Figure 2:
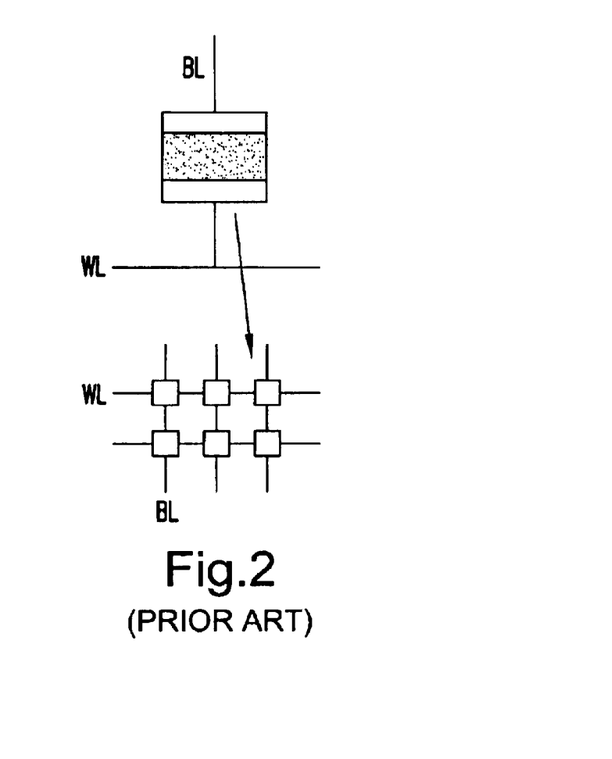
FIG. 2 shows a passive matrix addressing structure with memory cells formed at the intersection of crossing electrodes in an orthogonal grid pattern, as mentioned above.

In the second class of devices, which is of particular relevance here, memory cells are laid out in a passive matrix architecture where two sets of mutually orthogonal electrodes form arrays of capacitor-like structures at the crossing points between the electrodes. Each memory cell may be created very simply as illustrated in FIG. 2, by employing ribbon-like electrodes that define an overlap region where they cross, the overlap region constituting a sandwich of polarizable material between parallel electrode planes. Alternative capacitor structures are possible, however, where the electrical fields that interact with the polarizable material have major components directed parallel to the substrate rather than perpendicular to it. Such "lateral" architectures shall not be discussed further here, however, since the particular choice of cell architecture is immaterial to the subject matter of the present invention. According to prior art, the data in individual memory cells are read by applying an electrical field to the material in each cell in question, of sufficient magnitude to overcome the hysteresis effect and align the electrical polarization in the cell in the direction of the applied field. If the material already were polarized in that direction prior to application of the field, no polarization reversal takes place and only a small transient current flows through the cell. If, however, the material had been polarized in the opposite direction, polarization reversal takes place, causing a much larger transient current to flow through the cell. Thus, the logic state, i.e. the direction of the electrical polarization in the individual memory cell, is determined by application of a voltage of magnitude sufficient to exceed the coercive field in the ferroelectric, and detection of the resulting current.

Compared to active matrix based devices, the passive matrix based ones can be made with much higher memory cell density, and the memory matrix itself is much less complex. However, the readout process according to prior art is destructive, involving loss of the data content in the cell that is read. Thus, data that are read must be written back into the memory device if further storage of those data is desired. A more serious consequence of the polarization switching is fatigue, i.e. a gradual loss of switchable polarization which typically is accompanied by a need for higher applied voltage to the cell to effect the polarization reversal. Fatigue limits the number of read cycles that can be sustained by a given memory cell and thus the range of applications. In addition, it leads to slower response and higher voltage requirements for the memory device. The attendant gradual variation in the operation parameters for individual memory cells in a given device cannot be predicted a priori and leads to a need for "worst case" design and operation which is sub-optimal.

Efforts have been made to develop techniques that allow non-destructive readout from ferroelectric-based memories while maintaining simple elementary memory cell architecture. Thus, C. J. Brennan describes ferroelectric capacitor cells and associated elementary circuit modules for data storage in U.S. Pat. Nos. 5,343,421; 5,309,390; 5,262,983; 5,245,568; 5,151,877 and 5,140,548. By probing the small-signal capacitance values while simultaneously subjecting the ferroelectric to moderate bias fields, i.e. bias fields that do not lead to the peak voltage across the cell during read-out exceeding the coercive field in the ferroelectric, the direction of the spontaneous polarization in the capacitor and thus the logic state of the memory cell is determined. However, there are certain very specific premises for applying the methods and apparatus as described by Brennan, invoking phenomena based on space charge accumulation at the electrodes which is explicitly dependent on the materials used in the electrodes and the adjoining ferroelectric. Read-out of data involves probing of the space charge, which must be performed on time scales that are compatible with such charge accumulation. Furthermore, Brennan's patents contain no teachings on how the small-signal and biasing voltages shall be timed and correlated in relation to each other, which is of paramount importance for implementation in practical devices. The above mentioned U.S. Pat. No. 5,140,548 describes a device which does not require bias from an external source, deriving an internal bias from a contact potential difference between the electrodes sandwiching the ferroelectric core. While elegant in principle, this solution suffers from serious drawbacks when faced with the task of implementations in practical devices. Thus, the predictability and control that can be achieved by external biasing is sacrificed, being replaced by a fixed bias which is explicitly dependent on materials purity and processing conditions as well as operating temperature. The unipolar and continuous nature of the internally generated bias promotes imprint in the ferroelectric, a well-known and highly undesirable phenomenon in ferroelectric memory devices. Finally, a fixed bias is of little or no value when implementing correlation strategies as taught in the present document.

Thus, there is a need for devices and methods whereby data can be read non-destructively from simple memory cells in the form of capacitors that are filled with an electrically polarizable material exhibiting hysteresis, which cells not being dependent on containing active circuit elements such as transistors. This need is particularly acute in passive matrix addressed memory structures with ferroelectric capacitors.

SUMMARY OF THE INVENTION

It is a major object of the present invention to provide a conceptual basis for non-destructive read-out of data from data storage devices containing cells with electrically polarizable media, in particular ferroelectrics.

By extension of the above, it is another object of the invention to permit read-out of data without incurring the fatigue and wear that accompany the traditional read-out by polarization switching and which limits the usable life span of memory devices based on ferroelectrics. Further it is an object of the invention to obviate the need for restoring the data content of cells that have been read, which is required in destructive readout techniques, and thus to simplify the readout protocol and reduce the hardware complexity.

It is a further object of the invention to enhance the reliability in the readout process by providing more than one discrimination criterion for determination of logic state in a given memory cell.

Finally, it is also an object of the present invention to describe generic procedures and hardware to implement such non-destructive read-out of data.

The above objects as well as additional features and advantages are achieved with a method according to the present invention, which is characterized by steps for applying a time dependent small-signal voltage over the capacitor, said small-signal voltage having an amplitude and/or duration less than that required for causing a significant permanent change in the polarization state of the capacitor, and recording at least one component of a generated small-signal current response over the capacitor, said at least one component having either a linear or non-linear relationship to said small-signal voltage, whereby said logic state is determined by at least one parameter, being a characteristic of said at least one recorded component, the determination of the logic state taking place by temporal correlation between said small-signal voltage and said at least one recorded component, and subject to a predetermined protocol.

In the method according to the invention it is advantageous applying the small-signal voltage superimposed on a quasi-static voltage of either polarity across said capacitor and then the quasi-static voltage may have either polarity or may be switched between a set of positive and/or negative values.

In the method according to the invention it is also advantageous applying said small-signal voltage superimposed on a low frequency or slowly varying voltage across the capacitor, said small-signal and said low frequency or slowly varying voltages in sum having an amplitude and/or duration less than that required for causing a significant permanent change in the polarization state of the capacitor, and then it is preferable recording a non-linear component of the current response to said small-signal voltage and correlating said non-linear component with said slowly varying voltage.

In a first advantageous embodiment of the method according to the invention the small signal voltage is selected as being periodic with a dominant Fourier component at frequency $\omega$, the phase of the $2^{nd}$ harmonic component of the current response is recorded, and the phase is compared with a reference phase derived from said time-dependent voltage impressed on the capacitor. In this connection the small-signal voltage can then preferably be selected as sinusoidal.

In a second advantageous embodiment of the method according to the invention the time-dependent small-signal voltage is selected as the sum of two periodically varying components with dominant Fourier components at frequencies $\omega_1$ and $\omega_2$, respectively, the phases of the components of said current response at the sum and difference frequencies $\omega_1+\omega_2$ and $\omega_1-\omega_2$, is recorded, and the phases are compared with a reference phase derived from the time-dependent voltage impressed on the capacitor. In this connection the periodically varying voltage components can then be selected as sinusoidal.

In the latter case it is considered advantageous recording the phases of two or more of the non-linear current response components, at $2\omega_1$ and/or $2\omega_2$ and/or $\omega_1+\omega_2$ and/or $\omega_1-\omega_2$, and comparing said with a reference phase derived from said time dependent voltage impressed on the capacitor, or alternatively recording the phases of two or more of the non-linear current response components, at $2\omega_1$ and/or $2\omega_2$ and/or $\omega_1+\omega_2$ and/or $\omega_1-\omega_2$, and comparing the phases with a reference phase derived from a reference cell of known logic state that is subjected to the same driving voltages.

In a third advantageous embodiment of the method according to the invention the time-dependent small-signal voltage is superimposed on a biasing voltage of amplitude less than that required for causing significant, permanent change in the polarization state in the capac or, the first derivative of the non-linear current response to the time-dependent voltage is recorded as deduced via the small-signal current response to the time-dependent voltage, and the value of the first derivative is correlated with the magnitude and/or phase of the biasing voltage. In this connection the biasing voltage can then be selected as a DC offset voltage.

In the latter case the biasing voltage can be selected as a DC offset voltage which preferably is varied between a set of predetermined positive and/or negative values and then preferably periodically between a positive and a negative value.

In the third embodiment of the invention the biasing voltage can also be selected as a smoothly varying voltage sweeping a voltage range between two positive values or two negative values or a positive and a negative value. In this connection the biasing voltage can be swept periodically at a frequency lower than the time-dependent voltage, or the biasing voltage can be selected as varying sinusoidally with time.

Finally, in the method according to the present invention it is considered advantageous that the predetermined protocol assigns the logic state either of two logic values dependent on the value of the at least one parameter.

The above objects as well as additional features and advantages are also realized with an apparatus according to the invention which is characterized in comprising a phase-sensitive detector and discriminator connected with a memory cell for receiving one or more response signals therefrom and via a reference source with the signal generator for receiving a phase reference for the read signal input to the memory cell, said phase reference being applied as a reference in the phase sensitive detector and discriminator for determining a logic state of the memory cell by means of a phase comparison.

Finally, the above objects as well as additional features and advantages are also realized with another apparatus according to the invention which is characterized in comprising a phase sensitive detector connected with a memory cell and adapted for performing a phase sensitive detection of at least two phases in the response signal output from a memory cell, a reference source connected with said signal generator and adapted for generating phase references from the sum and differences of the phases detected in the response components, to the phase sensitive detector connected therewith, and a discriminator/logic circuit being connected with former for receiving the output thereof in the form of a phase comparison performed therein and adapted for determining a logic state of the memory cell.

In a preferred embodiment of this apparatus an $\omega+\pi$ phase shifter is connected with the reference source for receiving the output thereof and delivering the $\omega+\pi$ phase-shifted output to the phase sensitive detector and optionally also to the discriminator and logic circuit.

The foregoing and other objects, features and advantages of the invention will become more readily apparent from the following detailed description of preferred embodiments of the inventions, when read in conjunction with the appended drawing figures, of which

DETAILED DESCRIPTION OF THE INVENTION

As described above, prior art techniques for reading of logic state stored as a polarization direction in a ferroelectric capacitor in a memory cell shall typically involve either one of the following, viz. employing a microcircuit in each memory cell, where the sense of polarization in the memory capacitor (i.e. its logic state) determines the bias at the gate of a transistor and thus the current flow to a sense amplifier reading that cell, or imposing a voltage across the ferroelectric capacitor, of sufficient magnitude to cause polarization reversal in the capacitor. Depending on whether the sense of polarization in the capacitor is parallel or opposite to the imposed field, polarization will remain unchanged or flip to the opposite direction. While the former provides non-destructive read-out, there are severe problems relating to materials and processing, cf. above. The latter set of readout techniques are destructive, involving polarization switching with inherent fatigue problems, etc, and loss of data content.

As shall now be described with reference to generic electrical polarization response characteristics of materials exhibiting polarization remanence, in particular ferroelectrics, there exist alternative read-out methods that are non-destructive, simple to implement and compatible with active matrix as well as passive matrix addressing schemes. However, the physical phenomena that are involved are numerous and complex, and therefore it is necessary to tailor the read-out scheme to the materials, architectures and time scales of interest in each given situation.

According to the present invention, the logic state, i.e. the direction of the electrical polarization, in a given cell in the memory device is determined by recording the non-linear electric impedance response of said cell to a time-varying voltage with a voltage excursion much less than that which is required to effect polarization reversal in said cell. As will be shown, this non-linear response may exhibit a bias voltage dependent small-signal impedance where the magnitude of this impedance can be correlated with the bias voltage to reveal the logic state of the cell. Alternatively, the non-linearity engenders a response of different spectral frequency content than that of the exciting voltage, e.g. it may contain higher harmonics and/or sum—and difference frequency components relative to the frequency content of the exciting voltage, where the phase and/or magnitude of said non-linear response components shall be different, depending on the logic state of the cell.

In the present context, it is important to distinguish between the polarization response through interaction with the dipoles that are responsible for the remanent polarization, on the one hand, and on the other hand the response from the quasi-bound mobile charges that accumulate in response to the polarization set up by these dipoles and by the impressed field from the electrodes. This shall have an impact upon the frequencies and readout pulse protocols that can be used in each case, as well as upon possible restrictions that apply with respect to the selection of electrode materials.

Figure 3A:
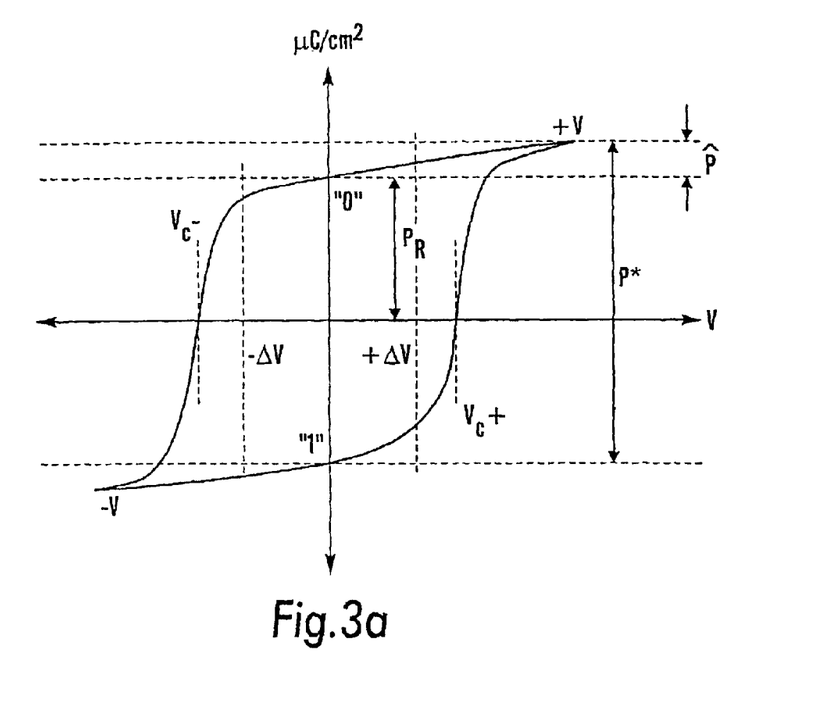
FIG. 3a shows a generic hysteresis curve for a memory substance of the ferroelectric type, with certain salient features highlighted.

With reference to the former case, the generic hysteresis loop shown in FIG. 3a illustrates the response of a pre-polarized medium to an impressed external voltage on the electrodes in the capacitor-like structure. The impressed voltage in this case follows a cyclic variation between two extreme values at positive and negative polarities as shown. The relationship is complex, where the local polarization vs. voltage response at a given point on the curve is dependent on previous polarization/voltage history as well as being non-linear on macroscopic as well as microscopic scales. Depending on whether the material has been prepared in a logic "0" and "1" state, respectively, there exist logic state-dependent differences in the local polarization vs. voltage response which can be exploited to provide nondestructive means for reading the logic state. These differences manifest themselves in a small-signal polarization response which depends on the position on the curve, and where the small-signal polarization response may contain both linear and non-linear response components relative to an imposed small-signal exciting voltage. Accordingly, the small-signal complex impedance sensed across a memory cell in the form of a capacitor containing material with characteristics as shown in FIG. 3a may be analyzed in correlation with the imposed voltages on the capacitor to reveal the logic state of the memory cell. It must be observed that the frequencies of the applied bias and small-signal probing voltages must be selected sufficiently low to allow the dipole-originated polarization to follow. Depending on the material in question, temperature, etc, the maximum allowable frequency may range widely (hundreds of Hz to GHz), with displacive inorganic ferroelectric ceramics responding very fast and alignment-based polymeric ferroelectric polymers responding more slowly.

Turning now to the latter case, where the polarization response is due to quasi-bound or mobile charges that accumulate under the influence of internal fields in the material, a survey of the scientific literature shows that the basic phenomena of polarization-dependent asymmetry, bias dependence and nonlinear response appears to be a general attribute of all ferroelectric materials in capacitor-like structures of the type relevant here. Although in many cases the magnitude of the polarization response is greatly diminished, this applies even at frequencies far exceeding those where the ferroelectric polarization can follow, in which case it is not pertinent to explain these phenomena in terms of the hysteresis curve of FIG. 3a.

In the present invention, the logic state, i.e. the direction and/or magnitude of the remanent polarization, is determined by exploiting the nonlinearities inherent in the polarization response of the material under an impressed electric field. Two basic approaches shall now be described.

Figure 3B:
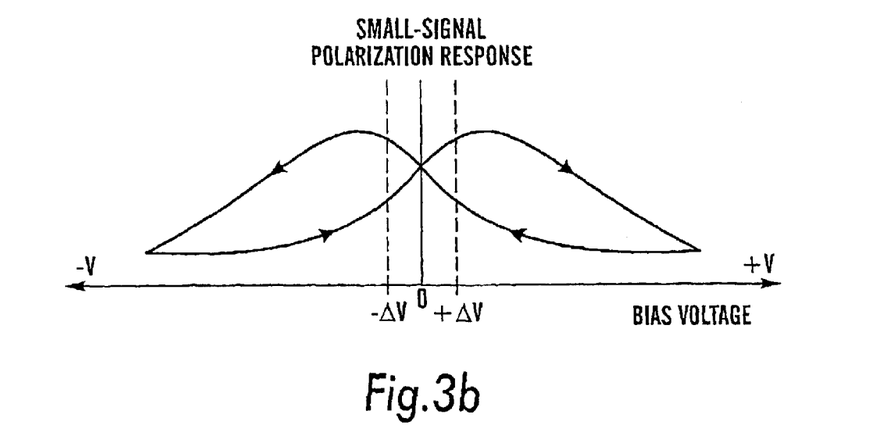
FIG. 3b shows a generic high-frequency small-signal polarization response as a function of polarization history and applied bias voltage.

In the first, the material is subjected to a small-signal probing voltage superimposed on a bias voltage, and the polarization response at the same frequency as that of the probing voltage is determined as a function of the bias voltage. A generic small-signal polarization response curve is shown in FIG. 3b. With the response being recorded at the same frequency as the driving voltage, this response is simply the bias-dependent capacitance which is related to the polarization state of the material. It is important to realize that while exhibiting the same qualitative behaviour, there is a fundamental difference between the physical mechanisms leading to such curves by interaction with accumulated quasi-bound or mobile charges on the one hand, and on the other hand curves obtained by small-signal probing of the slope of the hysteresis curve. Due to the similarities in certain of the read-out schemes to be described below, the descriptions of preferred embodiments as illustrated in FIGS. 4a–d shall be cast in terms of the local small-signal response on different parts of the hysteresis curve, which provides an easily understood intuitive grasp of the basic principles involved. It is to be understood, however, that the technical description of the read-out apparatus and voltage protocols shall also apply for the cases where quasi-bound and/or mobile charges are being probed. The latter case shall not only encompass frequency regions where full or partial reversal of the remanent polarization can take place as evidenced by hystersis curves, but also high-frequency regions where domain switching cannot follow. In this connection one may note that the readout schemes taught by C. Brennan in his above cited patents are explicitly based on interaction with accumulated space charges, according to a specific model where the probed space charges are proximate each electrode with a neutral region between, the relative size of the neutral and space charge regions defining the perceived capacitance. This places Brennan's schemes outside the realm of that part of the present discussion that is based on the hysteresis curves, as well as ignoring numerous other physical phenomena leading to small-signal response characteristics of the type shown qualitatively in FIG. 3b.

In the second, the material acts as a polarization-state dependent parametric mixing device, yielding an output response which contains new frequency components in addition to those present in the small-signal excitation voltage. Thus, driving the polarization at a given frequency engenders a polarization response and thus a detectable current which in addition to the fundamental frequency also contains higher harmonics. If the driving voltage contains several frequency components, the response may contain sum—and difference frequency components also, with specific phase relationships that can be uniquely linked to the remanent polarization state of the medium. Again, the descriptions in the examples given below are given with reference to the hysteresis curves, which provides a simple, intuitive approach to understanding the underlying principles. As discussed above, however, the same basic read-out principles and apparatus shall be applicable in high-frequency regimes where the polarization switching manifested in hysteresis curves cannot follow, being linked to quasi-bound or mobile space charges.

Certain preferred embodiments are described below by way of examples. They represent generic classes of possible implementations sharing the common feature of small-signal excitation of the memory cell to excite via non-linearity and polarization history generated asymmetry a logic state-dependent polarization response. In order to simplify the discussion, it shall be assumed that the polarization response to a time varying voltage of small amplitude shall trace back and forth along a portion of the curve in FIG. 3a. This assumption ignores the effects of partial switching and fatigue which lead to a gradual reduction in polarization magnitude, as well as causing the small-signal polarization response to exhibit hysteresis in itself.

Now a number of preferred embodiments shall be discussed in an exemplary manner, which shall not in any sense be regarded as limiting for the actual scope of the invention.

EXAMPLE 1

Differentials in Small-signal Polarization Response

The slope, i.e. the small-signal linear polarization response representing the first derivative $dP/dV$ of the hysteresis curve, is voltage- and history-dependent. In the generic curve shown in FIG. 3a the slope is identical for the two logic states at "0" and "1" and a slope measurement at these points shall not reveal the logic state. By imposing a certain voltage bias V and probing the slope behaviour in the vicinity of the points "1" and "0", the logic state can be determined. Now defining:

Slope near "0" and at bias voltage V=Slope$_{"0"}$ (V)
Slope near "1" and at bias voltage V=Slope$_{"1"}$ (V), one obtains from FIG. 3:

Slope$_{"0"}$(+ΔV)<Slope$_{"1"}$(+ΔV)
Slope$_{"0"}$(−ΔV)>Slope$_{"1"}$(−ΔV).

Figure 4A:
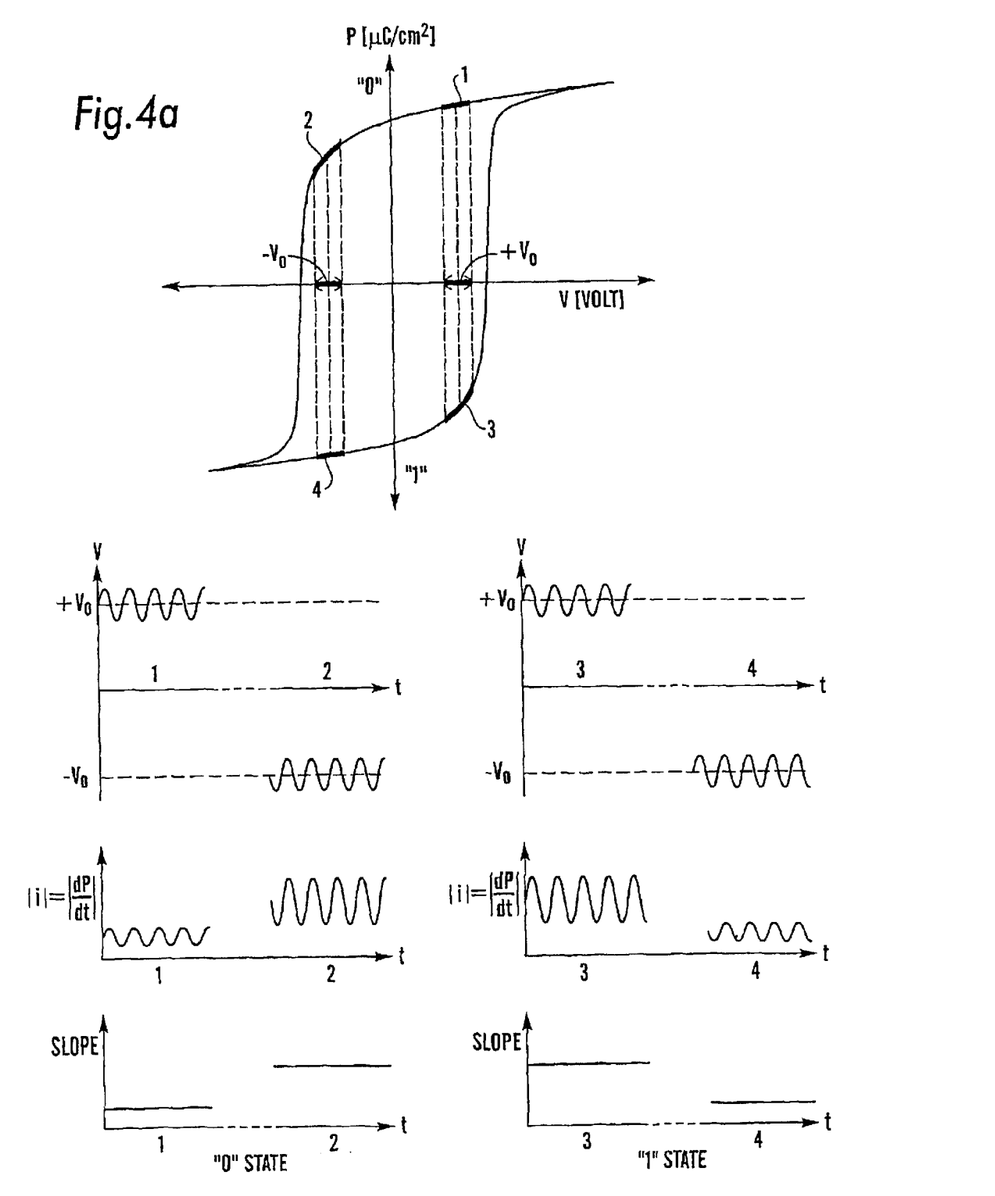
FIGS. 4a–4d show examples of read-out by local slope detection, i.e. the polarization vs. voltage response for a memory cell that is excited by a voltage signals as shown, according to the present invention.
Figure 4B:
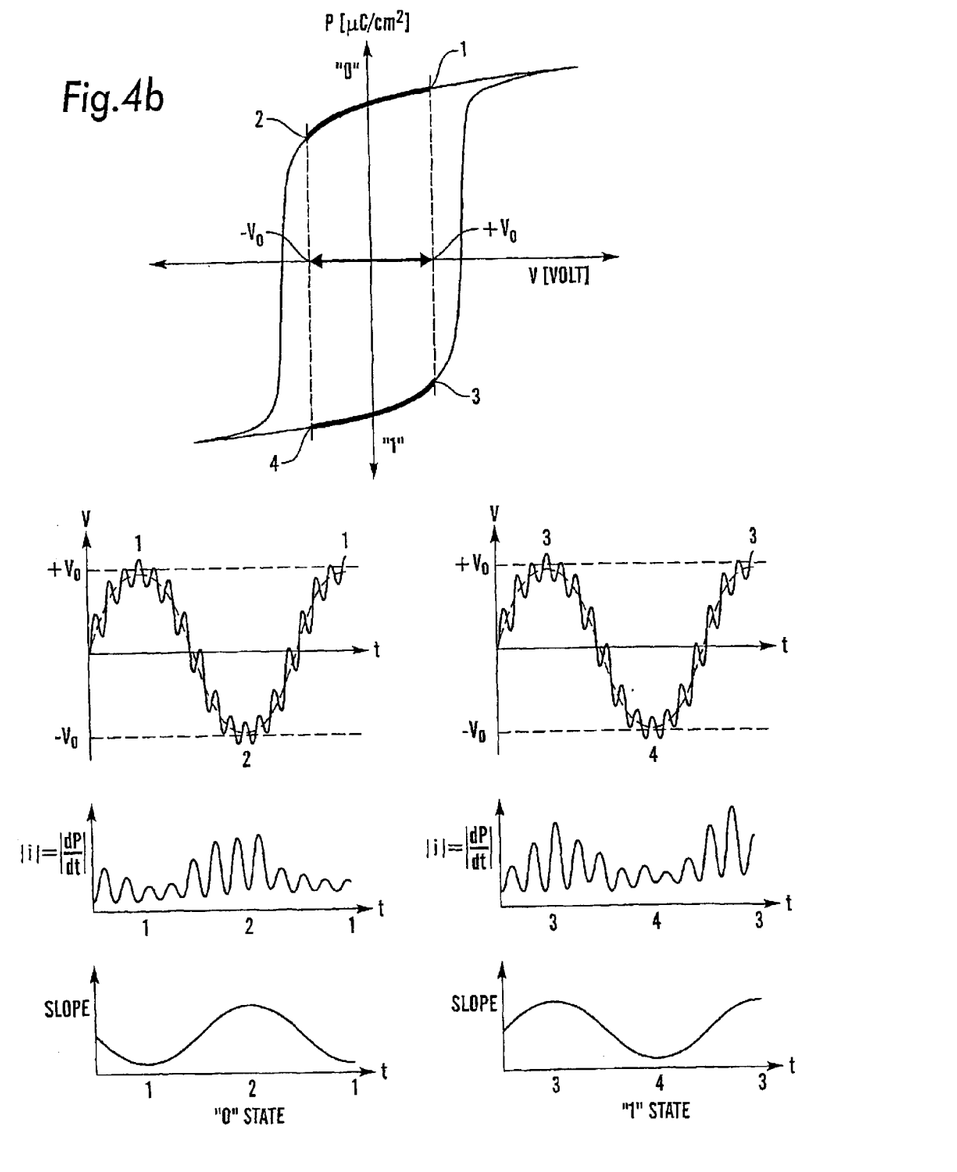
Figure 4C:
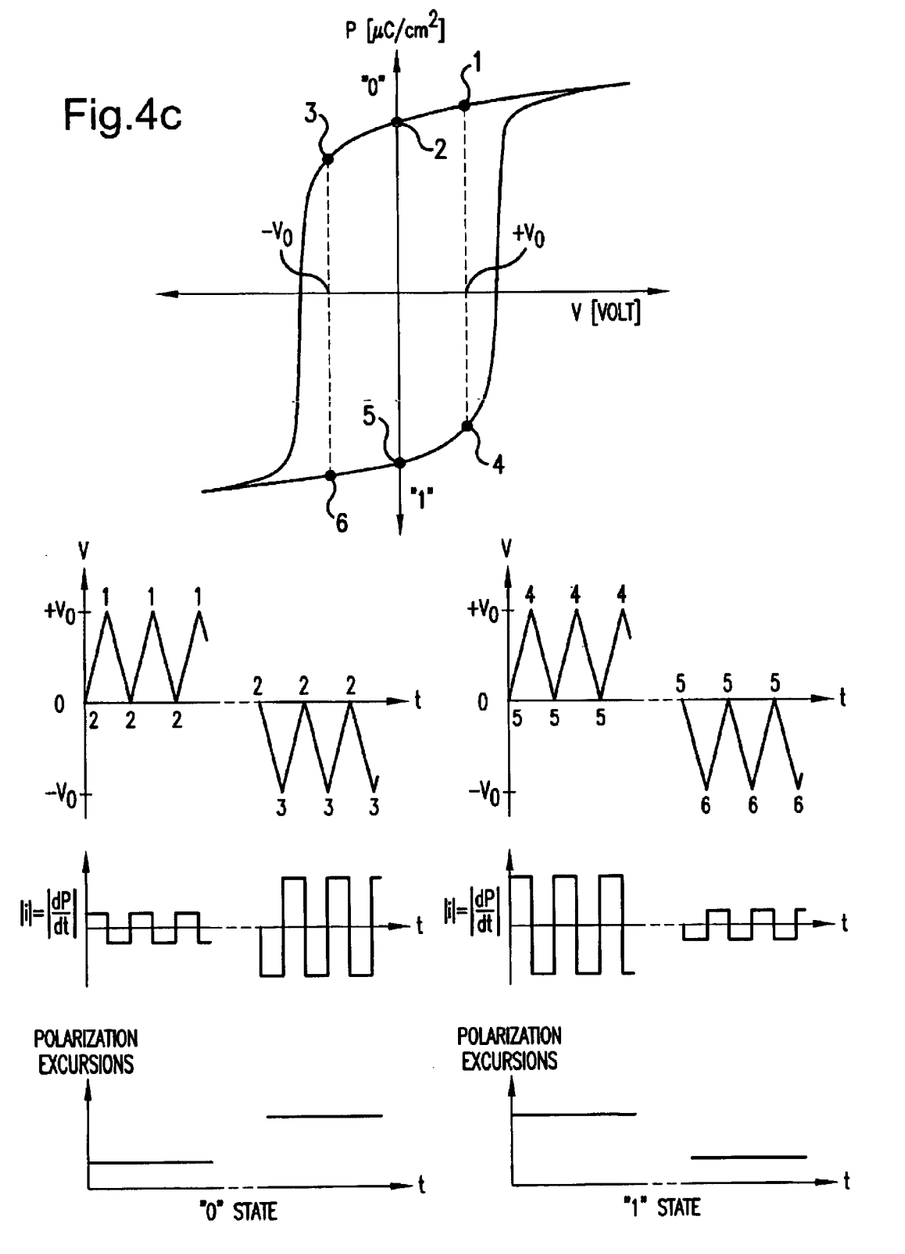

Thus, the logic state of the cell in question can be read out by applying a bias voltage of known magnitude and polarity and recording the slope in at least two points on the curve. This can be achieved in different ways:

a) By recording the magnitude of the slope at two or more discrete bias voltage values as illustrated in FIG. 4a, and comparing the differential between the slopes with a threshold value.

b) By monitoring the magnitude of the small-signal polarization response while imposing a probing voltage consisting of a slow periodic sweeping voltage on which is superimposed a small periodic voltage swing at a higher frequency, as illustrated in FIG. 4b.

c) By recording the differential polarization between selected discrete points on the hysteresis curve. An example is illustrated in FIG. 4c.

For a "0" logic state, one has

Figure 4D:
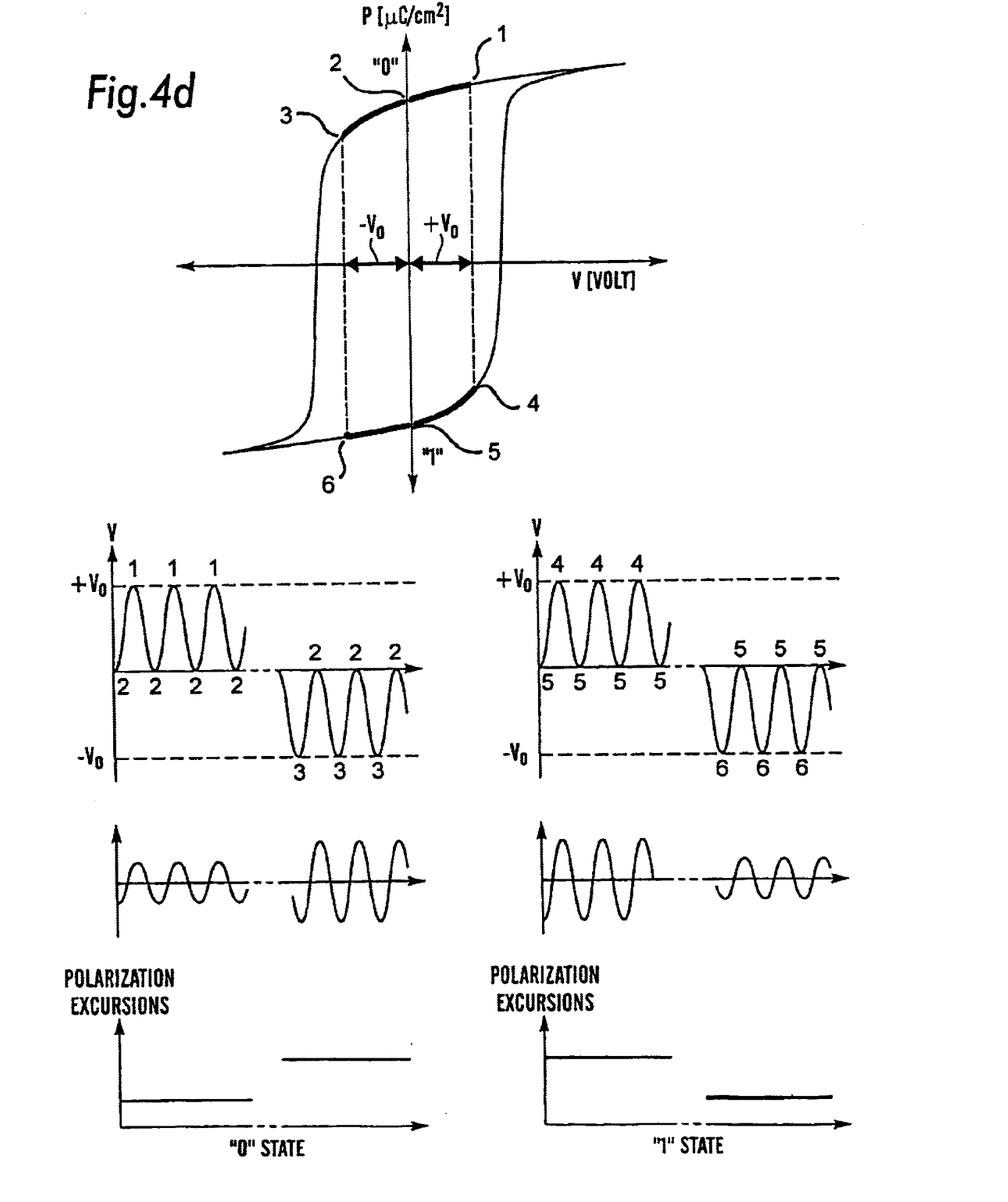

|P(+ΔV)−P(0)|<|P(0)−P(−ΔV)| while for a "1" logic state,

|P(+ΔV)−P(0)|>|P(0)−P(−ΔV)|.

d) By recording the asymmetry of the polarization excursions (peak-to-peak, RMS, or the like) in response to imposed sweeping voltages of positive and negative polarity. An example showing two separate sweeps is shown in FIG. 4d, but the asymmetry can be detected in a number of ways apparent to a person skilled in the electronic art.

EXAMPLE 2

Harmonic Detection of Response to Sinusoidal Input Voltage

The following simple treatment may be helpful in gaining an intuitive insight into the basic idea.

Referring to FIG. 3a, it is desired to establish whether the memory material in a given memory cell is in the logic state "0" or "1". The two logic states are characterized by different curvatures at the points where the hysteresis curve intercepts the V=0 axis. Expanding to $2^{nd}$ order, one may write:

$$P(\text{"0"}) = P_0 + \alpha V - \beta V^2 \quad (1)$$

$$P(\text{"1"}) = -P_0 + \alpha V + \beta V^2 \quad (2)$$

Figure 5A:
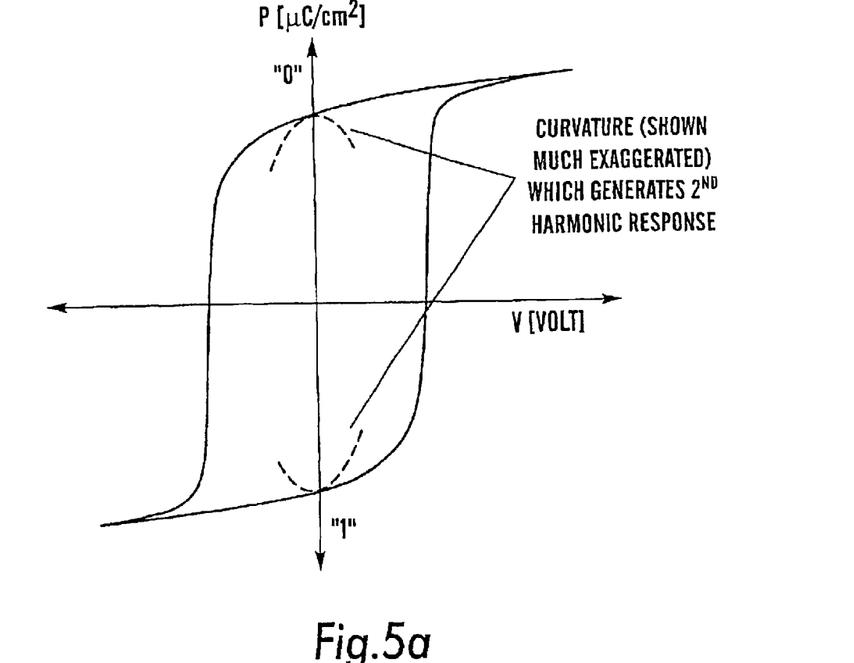
FIG. 5a shows the principle of read-out by second harmonic detection according to the present invention.

Assume now that the cell is excited by a sinusoidally varying voltage of amplitude much less than that which is required to switch the polarity of the cell, as illustrated in FIG. 5a, one has $$V(t) = V_0 \cos(\omega t) \quad (3)$$

The polarization response becomes $$P(\text{"0"}) = P_0 + \alpha V_0 \cos(\omega t) - \beta V_0^2 \cos^2(\omega t) = (P_0 - \tfrac{1}{2}\beta V_0^2) + \alpha V_0 \cos(\omega t) + \tfrac{1}{2}\beta V_0^2 \cos(2\omega t + \pi) \quad (4)$$

and $$P(\text{"1"}) = -P_0 + \alpha V_0 \cos(\omega t) + \beta V_0^2 \cos^2(\omega t) = -(P_0 - \tfrac{1}{2}\beta V_0^2) + \alpha V_0 \cos(\omega t) + \tfrac{1}{2}\beta V_0^2 \cos(2\omega t) \quad (5)$$

Thus, the polarization response of the memory cell at the $2^{nd}$ harmonic frequency depends on whether the cell is in a "0" or a "1" state, i.e. the $2^{nd}$ harmonic responses in the two states are in anti-phase to each other (mutually out of phase by 180 degrees). By suitable detection, e.g. coherent averaging (lock-in detection), this difference can manifest itself in a qualitative manner, for instance as a positive or negative polarity in a detection signal.

Figure 5B:
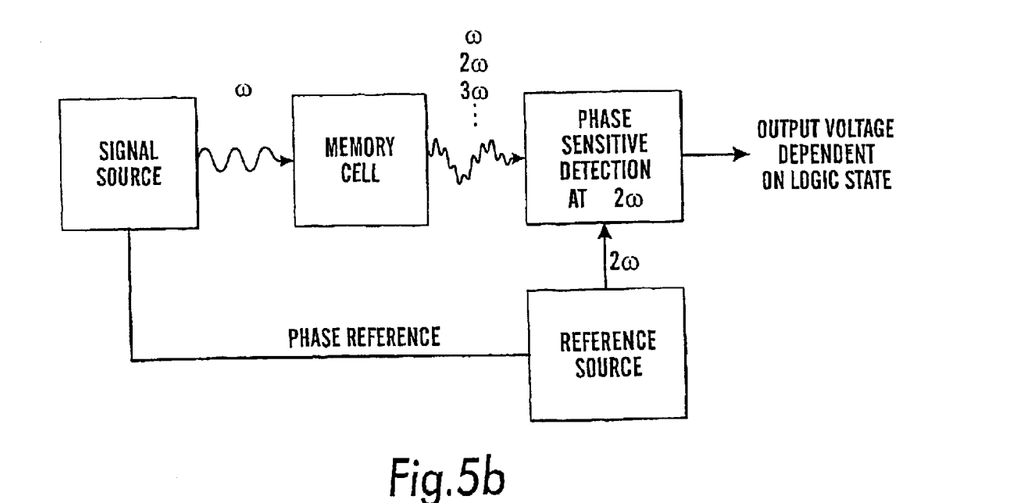
FIG. 5b shows a block diagram of an apparatus according to the invention and used for readout by second harmonic detection.

An apparatus according to the invention for performing a detection of the polarization response at the second hamonic is shown as a schematic block diagram in FIG. 5b. A signal source inputs a sinusoidally varying voltage at the frequency ω to a memory cell which outputs a response signal with harmonics to a phase-sensitive detector as shown. The phase-sensitive detector can in variant embodiments be regarded as a combined phase-sensitive detector and discriminator. Simultaneously the signal source also generates an input phase reference to a reference source which outputs a reference signal at twice the frequency ω of the read signal to the phase-sensitive detector. The output voltage from the phase-sensitive detector shall be dependent on the logic state of the memory cell, and the actual logic state can be based on simply a qualitative parameter, e.g. the polarity of the detection signal as stated.

As can be readily ascertained and as is apparent to persons skilled in the art of signal analysis, higher order non-linearities in the polarization response of the memory cell shall more generally result in higher than second harmonics appearing in the detected signal. By the same basic principles as outlined above and depending on the specific response characteristics of the memory cell in question, such signal components may also be extracted from the overall signal and reveal the direction of polarization and thus the logic state of the cell. Thus, the above example based on $2^{nd}$ harmonic detection shall not be implied or construed to preclude detection of higher than $2^{nd}$ harmonics as the operative principle for determination of the logic state of the cell in question.

EXAMPLE 3

Sum and Difference Frequency Detection of Response to Two Superimposed Sinuoidal Input Voltages Similarly to the treatment in the previous section, a simple analysis can be performed for the case where the excitation of the memory cell can be written as the sum of two sinusoidally varying voltages at two distinct frequencies $\omega_1$ and $\omega_2$. In this case, one has $$V(t) = V_1 \cos(\omega_1 t) + V_2 \cos(\omega_2 t), \quad (6)$$

and the polarization responses become $$P(\text{"0"}) = \left[P_0 - \tfrac{1}{2}\beta(V_1^2 + V_2^2)\right] + \alpha[V_1\cos(\omega_1 t) + V_2\cos(\omega_2 t)] + \tfrac{1}{2}\beta[V_1^2\cos(2\omega_1 t + \pi) + V_2^2\cos(2\omega_2 t + \pi) + 2V_1V_2(\cos((\omega_1 + \omega_2)t + \pi) + \cos((\omega_1 - \omega_2)t + \pi)], \quad (7)$$

and $$P(\text{"1"}) = -\left[P_0 - \tfrac{1}{2}\beta(V_1^2 + V_2^2)\right] + \alpha[V_1\cos(\omega_1 t) + V_2\cos(\omega_2 t)] + \tfrac{1}{2}\beta[V_1^2\cos(2\omega_1 t) + V_2^2\cos(2\omega_2 t) + 2V_1V_2(\cos(\omega_1 + \omega_2)t + \cos(\omega_1 - \omega_2)t)], \quad (8)$$

which can be seen to collapse to the expressions (4) and (5) by inserting $V_1 = V_2 = V_0/2$ and $\omega_1 = \omega_2 = \omega$.

Figure 6:
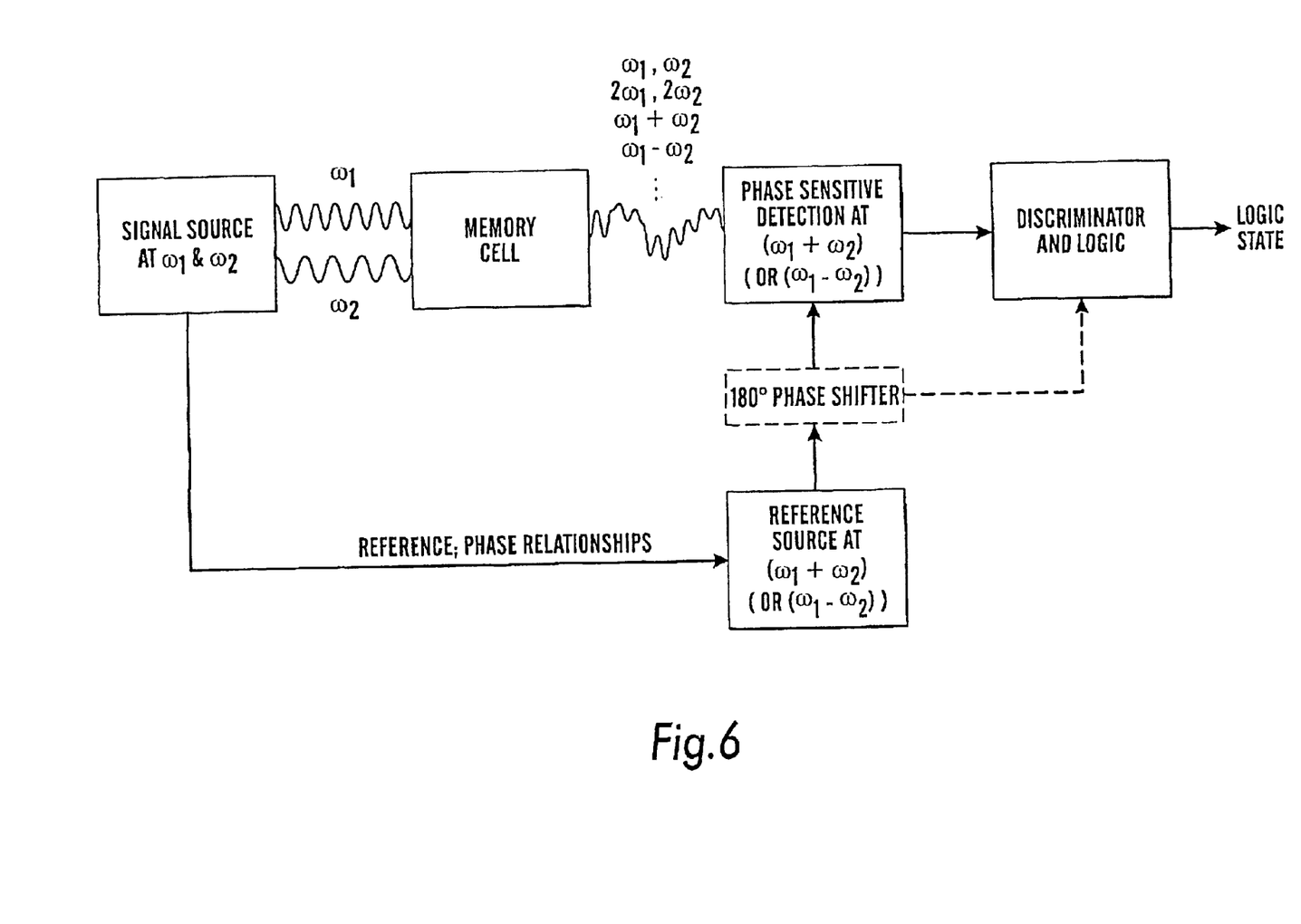
FIG. 6 shows block diagram of an apparatus according to the invention and used for readout by parametric mixing.

In addition to the linear time dependent responses at $\omega_1$ and $\omega_2$ and the $2^{nd}$ harmonic responses at $2\omega_1$ and $2\omega_2$ there are now response components at the sum and difference frequencies $(\omega_1 + \omega_2)$ and $(\omega_1 - \omega_2)$, as shown in FIG. 6. The latter are in anti-phase to each other, in analogy with the case discussed in the previous paragraph, depending on whether the cell is in a logic "0" or "1" state. This provides an alternative non-destructive route to data read-out, where it is possible to select the values of $\omega_1$ and $\omega_2$ in such a manner that the detection frequency at $(\omega_1 + \omega_2)$ or $(\omega_1 - \omega_2)$ is positioned in a convenient region, e.g. where noise spectral density is low and/or where the frequency is optimal for the sensing and processing circuitry. It is also possible to discriminate against harmonics of the excitation voltages that are injected into the detection circuitry by mechanisms unrelated to the polarization response of interest here (e.g. non-linearities in the driving or detection circuitry).

An apparatus for performing a sum and difference frequency detection of the response to sinusoidal input voltages at respectively frequencies $\omega_1$ and $\omega_2$ is shown in block diagram form in FIG. 6. Herein a signal source generating read signals as frequency $\omega_1$ and $\omega_2$ respectively input these signals to a memory cell and the response from of the memory cell is input to a phase-sensitive detector which performs the detection at respectively the sum frequency $\omega_1+\omega_2$ or the difference frequency $\omega_1-\omega_2$. A reference source is connected with a signal source for receiving the appropriate phase relationships and outputs reference sum and difference frequencies to the phase-sensitive detector, the output of which is connected to a discriminator/logic circuit for performing the necessary phase comparison in order to determine the actual logic state of the memory cell. Optionally a $\omega+\pi$ phase shifter is connected between the reference source and the phase-sensitive detector for delivering the reference shifted by $\pi$ to the phase-sensitive detector and optionally to the discriminator/logic circuit.

Since the logic state of the cell manifests itself in the phase responses at several different frequencies simultaneously (i.e. $2\omega_1$, $2\omega_2$, $\omega_1+\omega_2$ and $\omega_1-\omega_2$), the phase detection results may be correlated at two or more frequencies to enhance the confidence and/or speed in each readout operation.

EXAMPLE 4

Non-linear Response Detection Where Input Voltages have a DC or Low Frequency Offset A nearly universal attribute of non-linear responses in matter is the strong dependence on the amplitude of the excitation. As was mentioned in the above, it must in the present case be selected an excitation which is sufficiently strong to permit rapid and reliable detection of the non-linear response, while at the same time being so weak that the polarization in the memory material is not reduced or reversed.

Another strategy for increasing the detection signals is to move the operating point to a region on the hysteresis curve where the latter exhibits a strong non-linear relationship between the polarization response and the applied voltage. This can be-illustrated by referring to FIGS. 3a and 7a.

Figure 7A:
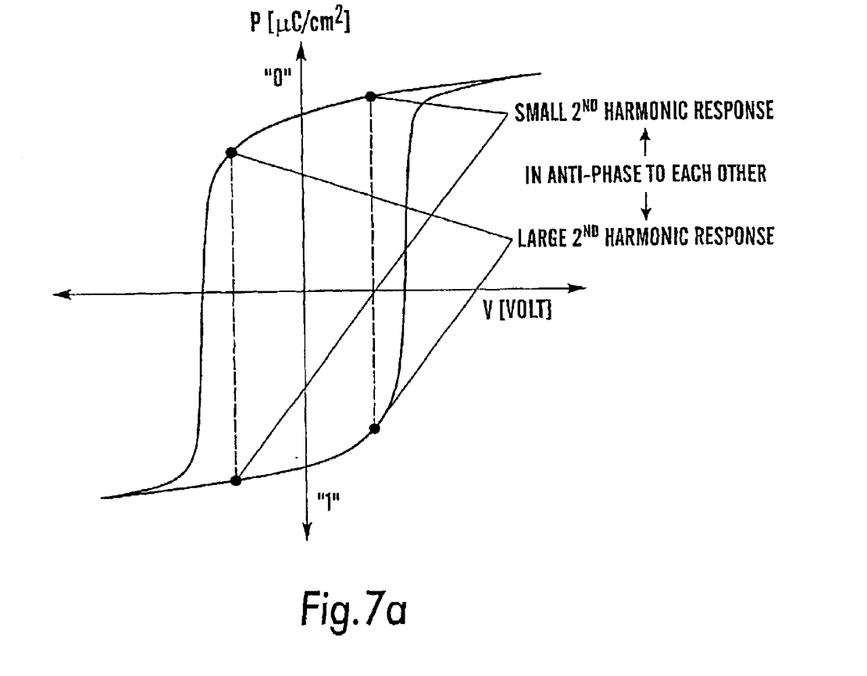
FIG. 7a shows the principle of readout by enhancement of $2^{nd}$ harmonic response by a periodically shifted offset voltage according to the present invention.

Assume, e.g. that the cell is in a "1" logic state, and that a small sinusoidally varying field at frequency co is applied to probe the $2^{nd}$ harmonic response. Now, however, there is a DC offset voltage which may be selected to position the working point on the hysteresis curve, viz.

$$V(t)=V_{OFFSET}+V_0 \cos{(\omega t)} \tag{9}$$

Assuming for simplicity that the $2^{nd}$ harmonic is directly proportional to the upwards or downwards curvature of the hysteresis curve at the working point, one can see by inspection of FIG. 3a that for a cell in the "1" logic state, the $2^{nd}$ harmonic signal shall increase in strength as $V_{OFFSET}$ increases from zero and approaches $V_C$ (in practice, the maximum voltage permissible in a passive matrix addressed memory shall be $V_C/3$, to avoid disturbing the other memory cells in the matrix), and for a cell in the "0" logic state, the $2^{nd}$ harmonic signal is in anti-phase to the "1" signal and remains small as $V_{OFFSET}$ increases from zero and upwards.

Conversely, if $V_{OFFSET}$ is negative, the result is the mirror image of that above: As the offset voltage is given increasing negative values, the $2^{nd}$ harmonic signal remains small if the cell is in the "1" logic state, and increases if the cell is in the "0" logic state.

Thus, in addition to a possible enhancement of the $2^{nd}$ harmonic signal strength, the application of an offset voltage introduces additional phenomena which can be exploited to reveal the logic state of the cell, as shown in FIG. 7. In a "1" state the $2^{nd}$ harmonic signal amplitude increases in response to an offset voltage of positive polarity, while remaining small at negative polarity offset voltages. In a "0" state the signal increases in response to an offset voltage of negative polarity and remains small at positive polarity offset voltages. Amongst several excitation voltage protocols which can be used for data read-out based on this asymmetry, one preferred embodiment involves a sequence of measurements with different DC offset voltages, exemplified by the simple case where two $2^{nd}$ harmonic amplitude and phase measurements are made, one at $+V_{OFFSET}$ and one at $-V_{OFFSET}$. If the cell is in a "1" state, this shall reveal itself as a large $2^{nd}$ harmonic signal with in-phase correlation with a reference signal when the offset is $+V_{OFFSET}$, and a smaller $2^{nd}$ harmonic signal with the same phase at $-V_{OFFSET}$ offset. If the cell is in a "0" state, the $2^{nd}$ harmonic signal shall be small and in anti-phase to the reference signal when the offset is $+V_{OFFSET}$, and large but still in anti-phase when the offset is $-V_{OFFSET}$.

For performing a non-linear response detection with input voltages with either a DC or low frequency offset a variant embodiment of the apparatus shown in FIG. 5b may be used. This variant embodiment conforms to the schematic block diagram of FIG. 7b. A signal generator outputs the sinusoidal read signal superimposed on biasing voltage in the form of a DC offset voltage or alternatively a slowly varying offset voltage. The memory cell outputs a response signal with a frequency component at $2\omega$ which is input to a combined phase-sensitive detector and discriminator for determining the logic state of the memory cell. The combined phase-sensitive detector and discriminator is also connected with the signal generator for receiving a reference signal in the form of the sinusoidal varying voltage at frequency $\omega$ superimposed on the offset voltage as shown.

EXAMPLE 5

Figure 8A:
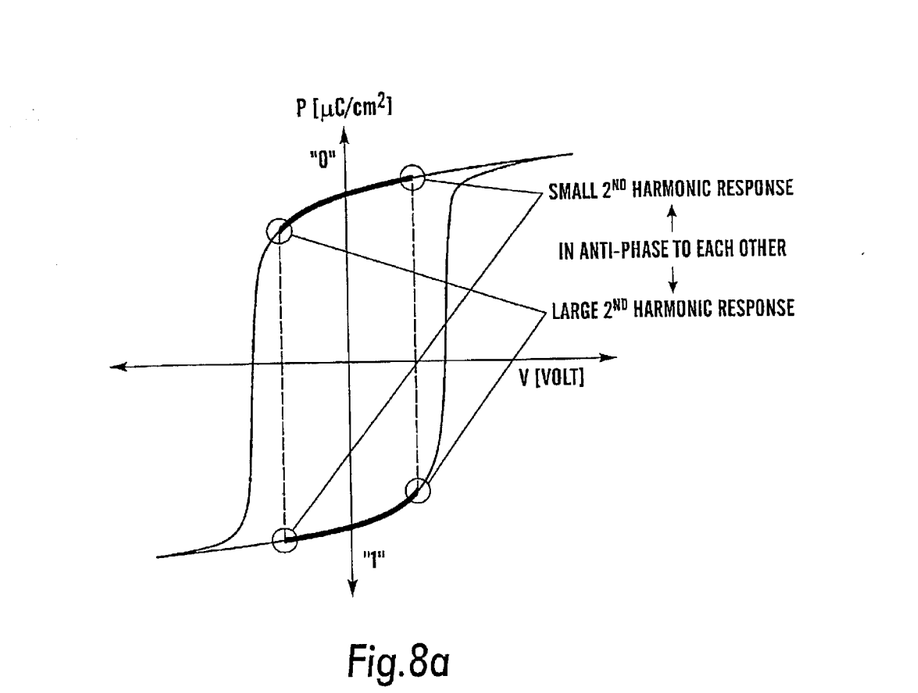
FIG. 8a shows the principle of readout by periodic modulation of $2^{nd}$ harmonic response by a sinusoidal, lower frequency offset voltage according to the present invention, and FIG. 8b a shows a variant of the apparatus in FIG. 5b and used for readout by periodic modulation of the second harmonic response.

Frequency Detection of Response When Using an Offset Voltage and Sinuoidal Voltage with Widely Different Frequencies and Voltage Values Another preferred embodiment exploiting the asymmetric offset dependence of the $2^{nd}$ harmonic response involves the application of a continuously varying offset voltage, e.g. a sinusoidal offset voltage that oscillates at a frequency $\Omega$ which is much less than the frequency $\omega$ of the voltage that excites the $2^{nd}$ harmonic, as shown in FIG. 8. Then $$V(t)=V_{OFFSET} \cos{(\Omega t)}+V_0 \cos{(\omega t)} \tag{10}$$

This is a special case of the two-frequency excitation described above, but now $\Omega<<\omega$, and $V_{OFFSET}>>V_0$. Since the non linear response coefficient $\beta$ in (1) and (2) depends on the offset voltage, an implicit time dependence is obtained as $$\beta=\beta(V_{OFFSET} \cos{(\Omega t)}), \tag{11}$$

and the $2^{nd}$ harmonic response is modulated at the frequency $\Omega$, to first order. The dependence of $\beta$ upon the offset voltage depends on the material in question, and the temporal behaviour of the polarization response at $2\omega$ may be quite complex. However, a hysteresis curve of the general shape shown in FIG. 1 shall yield a $2^{nd}$ harmonic response which is amplitude modulated with a maximum at a time $t_p$ when the offset voltage reaches its peak value in the positive polarity direction, for a "1" logic state. For a "0" state, the maximum $2^{nd}$ harmonic response occurs at peak negative polarity in the offset voltage, i.e. at time $t_p+\pi/\Omega$. Again, the $2^{nd}$ harmonic signal phases are in antiphase in the two instances. From these manifestations, a person skilled in the electronic art shall be able to design electronic circuitry which can detect whether the cell in question is in a "1" or "0" logic state.

Figure 7B:
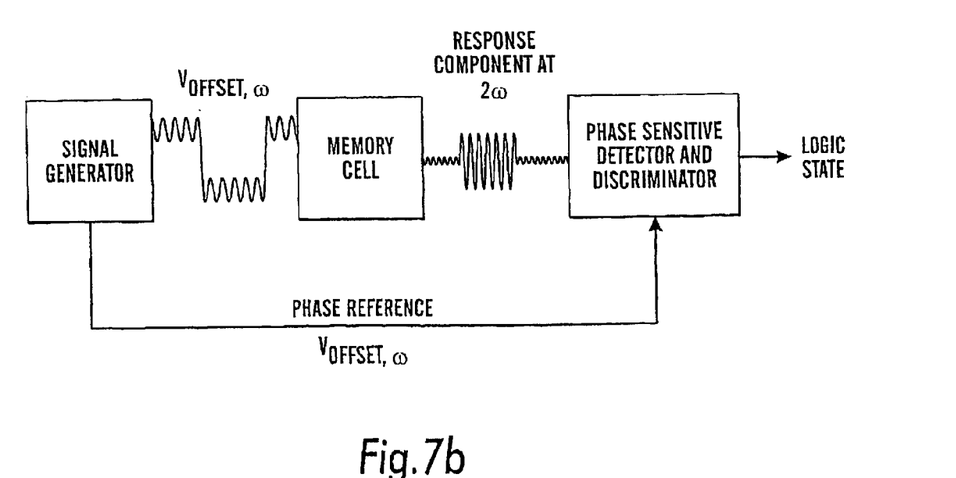
FIG. 7b shows a block diagram of a variant of the apparatus in FIG. 5b and used for readout by enhancement of the second harmonic response.
Figure 8B:
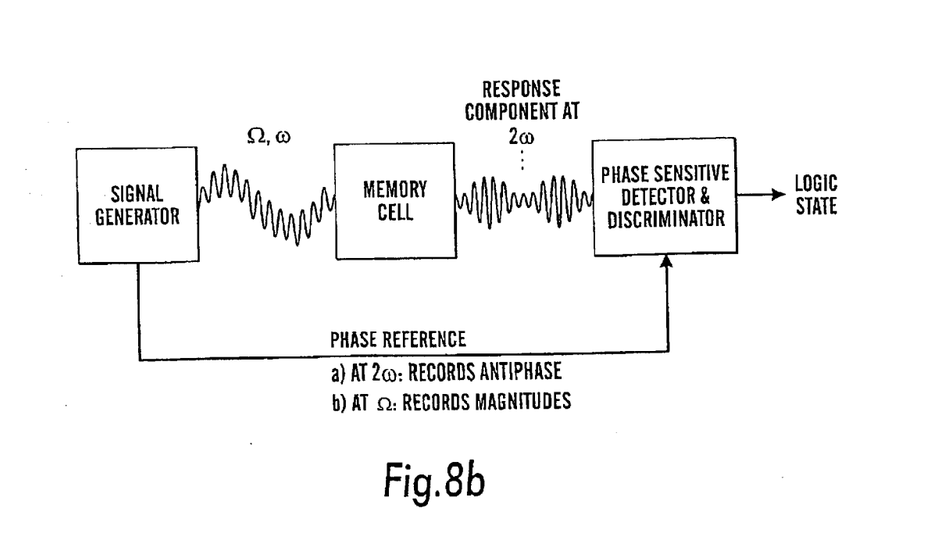

For detection of the response when using an offset voltage and a sinusoidal voltage as disclosed in the above example, a variant embodiment of the apparatus in FIG. 7b can be used. This variant embodiment is shown in block diagram form in FIG. 8b and comprises a signal generator outputting the sinusoidally varying voltage of frequency $\omega$ superimposed on a slowly varying sinusoidal offset voltage at a low frequency $\Omega$ as shown, to the memory cell which outputs a response signal component at the frequency $2\omega$ to the phase-sensitive detector and discriminator for determining the logic state of the memory cell. The signal generator also outputs a phase reference at respectively $2\omega$ for recording the antiphase of the second harmonic signal phases as well as the offset signal of frequency $\Omega$ for recording the magnitude in the response signal.

Since this concept for data read-out does not cause polarization reversal in the memory medium, it carries with it substantial advantages, as set out and high-lighted below.

Being non-destructive, no refresh writing cycle needs to be implemented, conferring speed and simplicity to the memory device.

In all presently known memory substances of relevance, fatigue is linked to the number of polarization reversals that the material has been subjected to. Obviating the need for polarization switching during read-out of data implies a dramatic increase in lifetime for virtually all types of memory devices, since read operations are typically performed more often than write operations.

In the case of sum frequency or harmonic detection, discrimination between a "0" and a "1" bit can be cast in terms of qualitative criteria such as determining the polarity of a voltage rather than analogue threshold detection of voltages on a grey scale. This may simplify the post-detection circuitry that makes decisions regarding logic state.

What is claimed is:

1. A method for determining a logic state of a memory cell in a data storage device, wherein said cell stores data in the form of an electrical polarization state in a capacitor containing a polarizable material, wherein said polarizable material is capable of maintaining a non-vanishing electrical polarization in the absence of an externally impressed voltage across said capacitor, and of generating a current response to an applied voltage, said current response comprising linear and non-linear components, said method comprising:

applying a time-dependent small-signal voltage over said capacitor, said small-signal voltage having an amplitude and/or duration less than that required for causing a significant permanent change in the polarization state of said capacitor, and recording at least one component of a generated small-signal current response over said capacitor, said at least one component having either a linear or non-linear relationship to said small-signal voltage, wherein said logic state is determined by at least one parameter, being a characteristic of said at least one recorded component, the determination of the logic state taking place by temporal correlation between said small-signal voltage and said at least one recorded component, and subject to a predetermined protocol.

2. A method according to claim 1, wherein said small-signal voltage being applied superimposed on a quasi-static voltage, of either polarity across said capacitor.

3. A method according to claim 2, wherein said voltage having either polarity or being switched between a set of positive and/or negative values.

4. A method according to claim 1, further comprising:

applying said small-signal voltage superimposed on a low frequency or slowly varying voltage across said capacitor, said small-signal and said low frequency or slowly varying voltages in sum having an amplitude and/or duration less than that required for causing a significant permanent change in the polarization state of said capacitor.

5. A method according to claim 4, further comprising:

recording a non-linear component of the current response to said small-signal voltage and correlating said non-linear component with said slowly varying voltage.

6. A method according to claim 1, further comprising:

selecting said small-signal voltage as being periodic with a dominant Fourier component at frequency $\omega$, recording the phase of the $2^{nd}$ harmonic component of said current response, and comparing said phase with a reference phase derived from said time-dependent voltage impressed on said capacitor.

7. A method according to claim 6, further comprising:

selecting said small-signal voltage as being sinusoidal.

8. A method according to claim 1, further comprising:

selecting said time-dependent small-signal voltage as the sum of two periodically varying components with dominant Fourier components at frequencies $\omega_1$ and $\omega_2$, respectively, recording the phases of the components of said current response at the sum and difference frequencies $\omega_2+\omega_2$ and $\omega_1-\omega_2$, and comparing said phases with a reference phase derived from said time-dependent voltage impressed on said capacitor.

9. A method according to claim 8, further comprising:

selecting said periodically varying voltage components as sinusoidal.

10. A method according to claim 9, further comprising:

recording the phases of two or more of the non-linear current response components, at $2\omega_1$ and/or $2\omega_2$ and/or $\omega_1+\omega_2$ and/or $\omega_1-\omega_2$, and comparing said phases with a reference phase derived from said time dependent voltage impressed on said capacitor.

11. A method according to claim 9, further comprising:

recording the phases of two or more of the non-linear current response components, at $2\omega_1$ and/or $2\omega_2$ and/or $\omega_1+\omega_2$ and/or $\omega_1-\omega_2$, and comparing said phases with a reference phase derived from a reference cell of known logic state that is subjected to the same driving voltages.

12. A method according to claim 1, further comprising:

superimposing said time dependent small-signal voltage on a biasing voltage of amplitude less than that required for causing significant, permanent change in the polarization state in said capacitor, recording the first derivative of said non-linear current response to said time dependent voltage as deduced via the small-signal current response to said time dependent voltage, and correlating the value of said first derivative with the magnitude and/or phase of said biasing voltage.

13. A method according to claim 12, further comprising:

selecting said biasing voltage as a DC offset voltage.

14. A method according to claim 13, further comprising:

selecting said biasing voltage as a DC offset voltage which is varied between a set of predetermined positive and/or negative values.

15. A method according to claim 14, further comprising:

selecting said biasing voltage varying periodically between a positive and a negative value.

16. A method according to claim 12, further comprising:

selecting said biasing voltage as a smoothly varying voltage sweeping a voltage range between two positive values or two negative values or a positive and a negative value.

17. A method according to claim 16, characterized by sweeping said biasing voltage periodically at a frequency lower than said time dependent voltage.

18. A method according to claim 16, further comprising:

selecting said biasing voltage as varying sinusoidally with time.

19. A method according to claim 1, wherein said predetermined protocol assigns said logic state either of two logic values dependent on the value of said at least one parameter.

20. A method according to claim 1, further comprising:

applying a second time-dependent voltage over said capacitor, the second time-dependent voltage being added to the first time-dependent small signal voltage, wherein at least one of the amplitude and the duration of the sum of the first time-dependent voltages is less than that required for causing a significant permanent change in the polarization state of the capacitor.

21. An apparatus for performing a phase comparison, comprising:

a signal generator for supplying a read signal with given phase to a memory cell, wherein the memory cell in response to the read signal outputs a response component at twice the given frequency of the read signal, and phase-sensitive detector and discriminator connected with a memory cell for receiving one or more response signals therefrom and via a reference source with the signal generator for receiving a phase reference for the read signal input to the memory cell, said phase reference being applied as a reference in the phase sensitive detector and discriminator for determining a logic state of the memory cell by means of a phase comparison.

22. An apparatus for performing a phase comparison, comprising:

a signal generator for supplying two or more read signals with given phases to a memory cell, wherein the memory cell in response to said read signals outputs a response signal having two or more non-linear current components, and phase sensitive detector connected with a memory cell and adapted for performing a phase sensitive detection of at least two phases in the response signal output from a memory cell, a reference source connected with said signal generator and adapted for generating phase references from the sum and differences of the phases detected in the response components, to the phase sensitive detector connected therewith, and a discriminator/logic circuit being connected with former for receiving the output thereof in the form of a phase comparison performed therein and adapted for determining a logic state of the memory cell.

23. An apparatus according to claim 22, further comprising:

an $\omega+\pi$ phase shifter connected with the reference source for receiving the output thereof and delivering the $\omega+\pi$ phase shifted output to the phase sensitive detector and optionally also to the discriminator and logic circuit.

* * * * *